US008139078B2

(12) United States Patent
Smoyer et al.

(10) Patent No.: US 8,139,078 B2
(45) Date of Patent: Mar. 20, 2012

(54) METHOD AND SYSTEM FOR EMULATING A DISPLAY

(75) Inventors: Erin Patricia Murphy Smoyer, Melissa, TX (US); Gregory S. Pettitt, Farmersville, TX (US); Jason Ryan Thompson, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 922 days.

(21) Appl. No.: 12/100,818

(22) Filed: Apr. 10, 2008

(65) Prior Publication Data

US 2009/0256856 A1 Oct. 15, 2009

(51) Int. Cl.

| | |
|---|---|
| ***G09G 5/00*** | (2006.01) |
| ***G09G 5/02*** | (2006.01) |
| ***H04N 1/46*** | (2006.01) |
| ***G03F 3/08*** | (2006.01) |
| ***G06K 9/00*** | (2006.01) |
| ***G06K 9/40*** | (2006.01) |

(52) U.S. Cl. ........ 345/589; 345/591; 345/581; 345/586; 345/600; 358/504; 358/518; 382/167; 382/254; 382/274

(58) Field of Classification Search .......... 345/426–428, 345/581, 586, 589–591, 600–601, 606, 618; 358/504, 523, 518–519; 382/162–167, 254, 382/274, 276, 300
See application file for complete search history.

(56) References Cited

U.S. PATENT DOCUMENTS

| | | | | |
|---|---|---|---|---|
| 6,231,190 | B1 | 5/2001 | Dewald | 353/31 |
| 2005/0030400 | A1* | 2/2005 | Shigeta | 348/294 |
| 2007/0291287 | A1* | 12/2007 | Snyder et al. | 358/1.9 |
| 2010/0265264 | A1* | 10/2010 | Doser et al. | 345/590 |

* cited by examiner

*Primary Examiner* — Wesner Sajous
(74) *Attorney, Agent, or Firm* — Warren L. Franz; Wade J. Brady, III; Frederick J. Telecky, Jr.

(57) ABSTRACT

In accordance with one embodiment, a method for emulating the color performance of a display system includes determining an expected first color gamut of the display system. Display data is converted into a format that emulates the first color gamut. The converted display data is displayed by a different display system having an expected second color gamut different than the expected first color gamut.

17 Claims, 3 Drawing Sheets

METHOD AND SYSTEM FOR EMULATING A DISPLAY

TECHNICAL FIELD

This disclosure relates in general to display systems, and more particularly to a method and system for emulating a display.

BACKGROUND

Modern display systems typically include multiple components that may each contribute optically to a display output. Product development for some display systems often includes displaying a final output of several working prototypes. The process of designing and building working prototypes, however, may include the production, installation, and calibration of expensive display system components that are often time-consuming to produce. Moreover, product development for some display systems may involve several iterations of designing, building, and fine-tuning multiple working prototypes before a desired display quality is achieved. In many cases, the failed iterations may increase the cost and time to produce a commercial product.

SUMMARY

In accordance with one embodiment, a method for emulating the color performance of a display system includes determining an expected first color gamut of the display system. Display data is converted into a format that emulates the first color gamut. The converted display data is displayed by a different display system having an expected second color gamut different than the expected first color gamut.

Some embodiments may enable the emulation of various different displays, thereby allowing viewers to evaluate and compare the effects of any of a variety of design considerations. Some such design considerations may include, for example, the specifications of particular hardware components, image processing techniques, or any of a variety of other suitable design considerations. The ability to efficiently emulate various different displays may significantly reduce research and development time and corresponding costs. For example, multiple iterations of various color filter designs may be efficiently and accurately evaluated by emulation without necessarily building a color filter for each evaluation. In some embodiments, different emulations may be displayed and evaluated simultaneously or successively.

Other technical advantages of the present disclosure will be readily apparent to one skilled in the art from the following figures, descriptions, and claims. Moreover, while specific advantages have been enumerated above, various embodiments may include all, some, or none of the enumerated advantages.

BRIEF DESCRIPTION OF THE DRAWINGS

For a more complete understanding of the present disclosure and its advantages, reference is now made to the following description, taken in conjunction with the accompanying drawings, in which.

DETAILED DESCRIPTION

Figure 1:
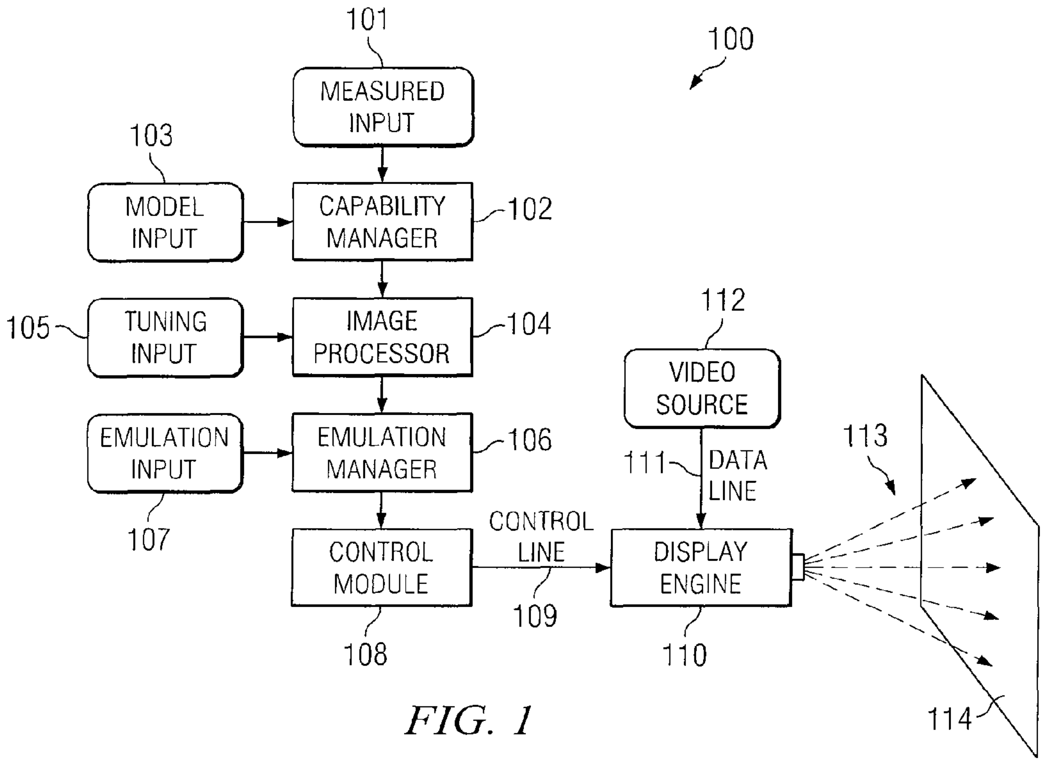
FIG. 1 is a block diagram illustrating a system for emulating a display according to one embodiment.
Figure 2A:
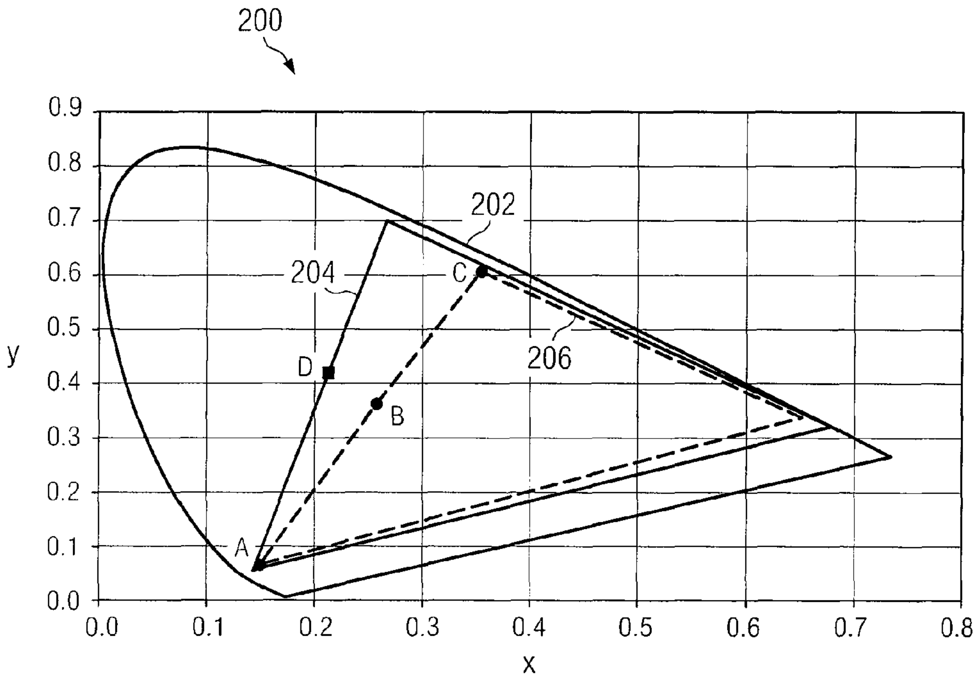
FIGS. 2A through 2C are CIE chromaticity diagrams comparing some example color gamuts of the system of FIG. 1 to the color gamuts of some example test systems.
Figure 2B:
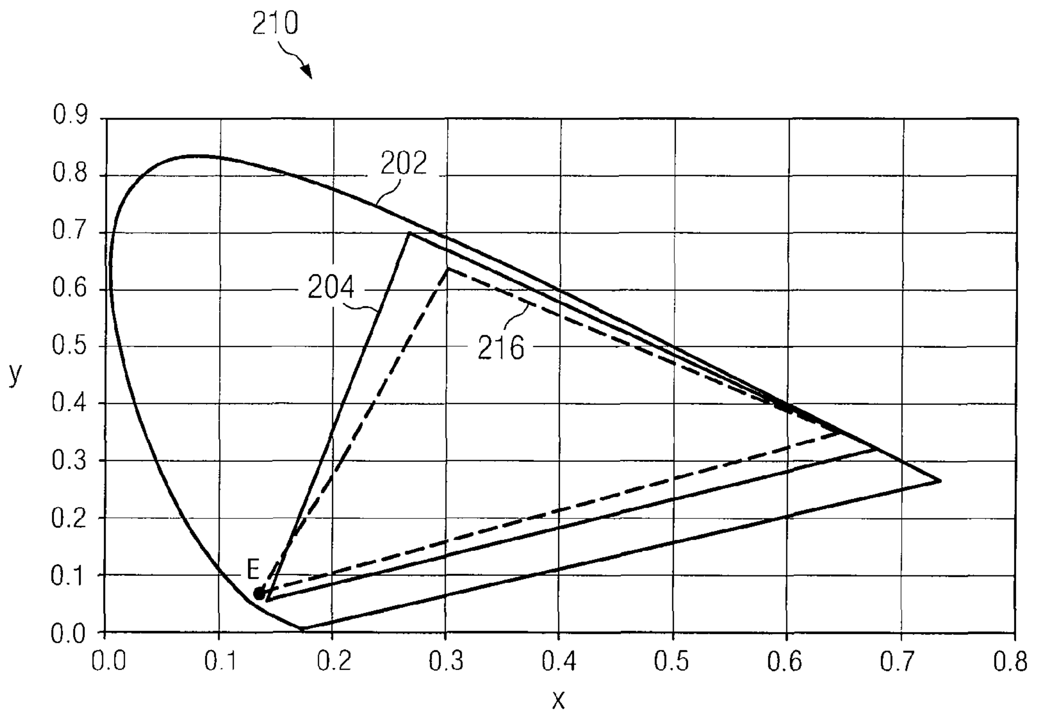
Figure 2C:
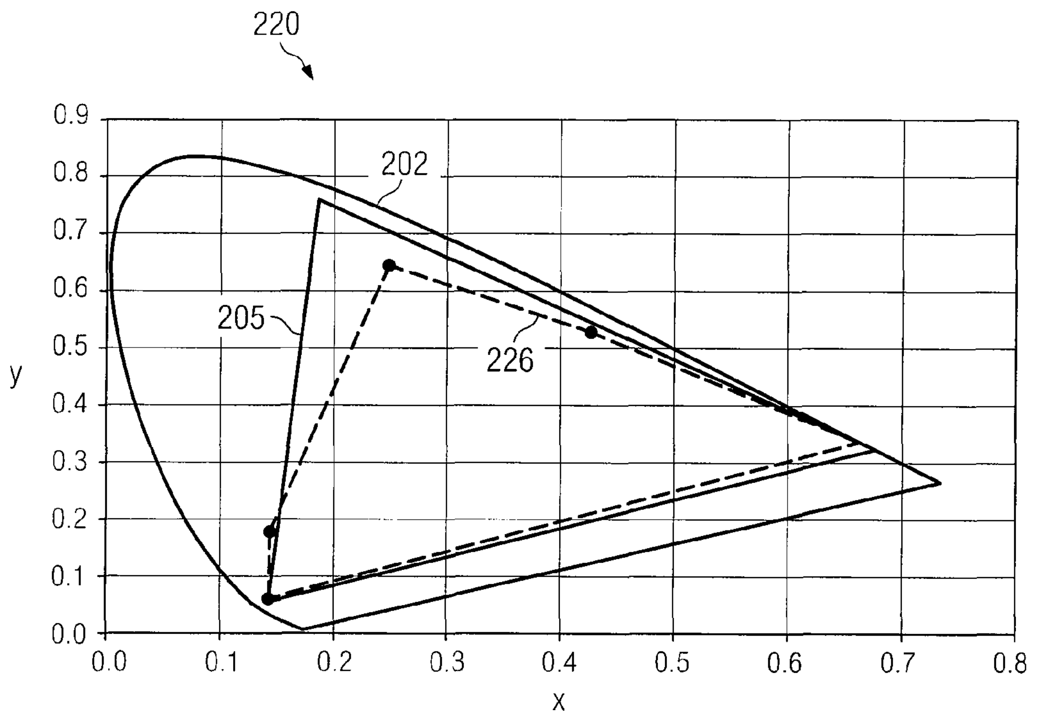
Figure 3:
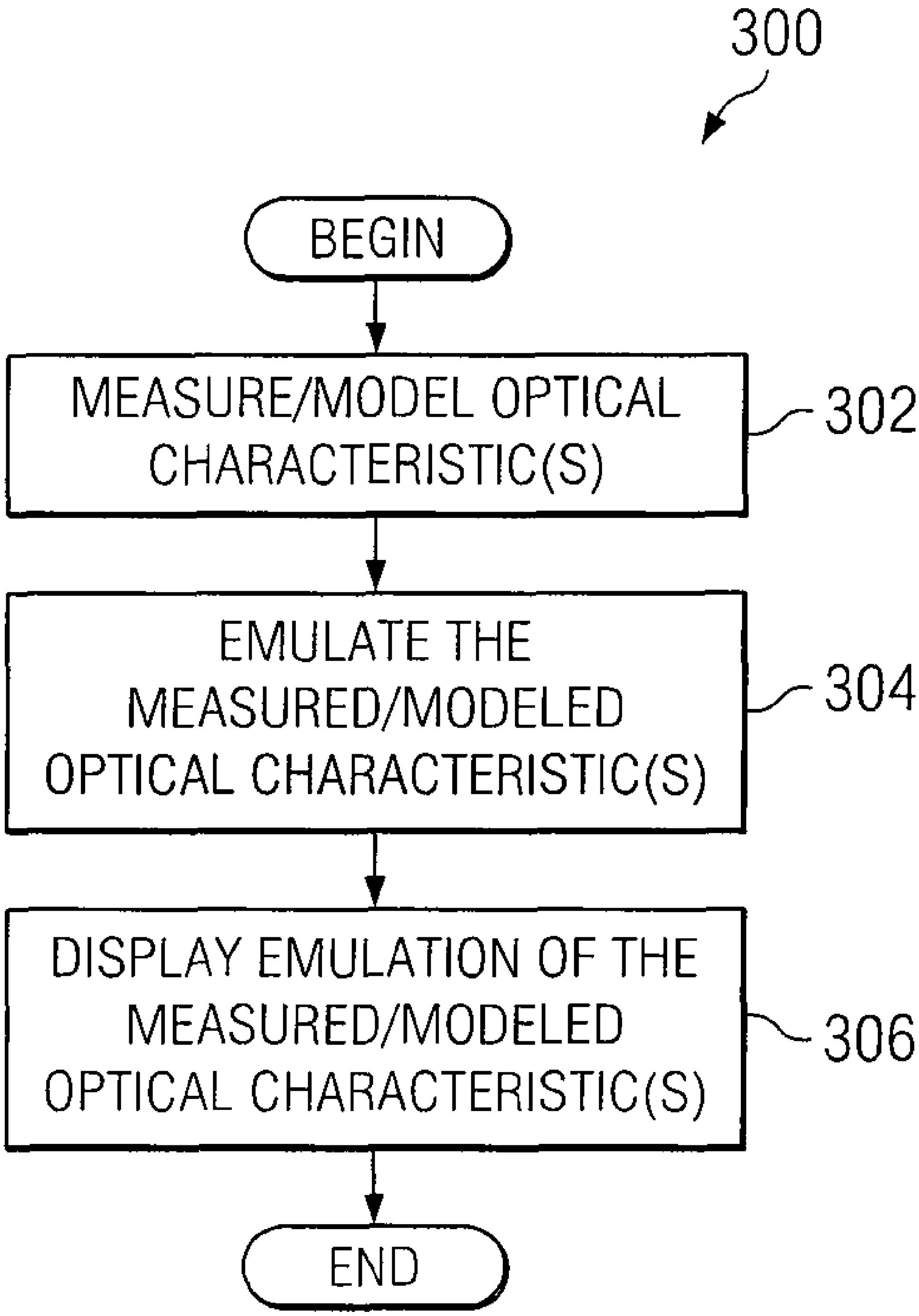
FIG. 3 is flowchart illustrating an example method for emulating a display according to one embodiment, which may be executed, at least in part, by the system of FIG. 1.

The example embodiments of the present disclosure are best understood by referring to FIGS. 1 through 3 of the drawings, like numerals being used for like and corresponding parts of the various drawings.

FIG. 1 is a block diagram illustrating a system 100 for emulating a display according to one embodiment. System 100 generally includes a capability manager 102, an image processor 104, an emulation manager 106, a control module 108, and a display engine 110. In operation, system 100 generally measures and/or mathematically models one or more optical characteristics (e.g., color gamut, contrast ratio, brightness, etc.) of an actual display and/or a corresponding design and generates a control signal accordingly. Display engine 110 receives the control signal along control line 109 and a data signal from a video source 112 along data line 111. Display engine 110 uses the control and data signals to generate an optical output 113 that is displayable on a display surface 114. The optical output 113 may emulate the measured and/or modeled optical characteristic(s), thereby at least partially simulating an optical output of an actual display and/or a particular design that may or may not be implemented as a working prototype. The display and/or design being emulated by system 100 is generally referred to herein as the test system.

Capability manager 102 generally refers to any hardware, software, firmware, or any combination of the preceding capable of generating a computer-readable representation of one or more optical characteristics of a test system. According to one embodiment, capability manager 102 resides within computer-readable storage of a client (not explicitly shown); however, capability manager may include any of a variety of other hardware, software, firmware, or any combination of the preceding capable of generating a computer-readable representation of one or more optical characteristics of a test system. In this example, one or more measured input(s) 101 and one or more model input(s) 103 provide the measured and modeled optical characteristic(s) of a test system, respectively, to capability manager 102. The measured and/or modeled optical characteristic(s) may correspond to actual or theoretical optical characteristic(s) of a particular display and/or design, as explained further below.

In this example, capability manager 102 generally processes the measured and/or modeled optical characteristics provided by measured input(s) 101 and/or model input(s) 103, respectively, and generates a computer-readable representation of the processed inputs. In some embodiments, the computer-readable representation may include a system color matrix or a multi-dimensional look-up table that numerically summarizes the color capabilities of the test system. In some embodiments, capability manager 102 may include a graphical user interface (GUI) accessible from a client (not explicitly shown). Such a GUI may facilitate interfacing with capability manager 102 and/or modifying model input(s) 103. Capability manager 102 communicates the computer-readable representation to image processor 104.

Image processor 104 generally refers to any hardware, software, firmware, or any combination of the preceding capable of performing image processing. According to one embodiment, image processor 104 resides within computer-readable storage of a client (not explicitly shown); however, capability manager may include any of a variety of other hardware, software, firmware, or any combination of the preceding capable of generating a computer-readable representation of one or more optical characteristics of a test system. In this example, image processor 104 generally performs image processing on the computer-readable representation generated by capability manager 102.

The term color scheme generally refers to the apportioned use of three or more colors to create a full color gamut for a test system. Color schemes may or may not be directly related to the hardware used to generate a colored display. For example, a color scheme may include a particular shade of magenta even though the individual components of test system (e.g., a color filter, a light emitting diode, a laser, a liquid crystal panel, a coated screen, etc.) might not independently transmit magenta colored light. Some color schemes may use three primary colors (e.g., red, green, and blue) to generate a displayable range of colors. Some other color schemes may use alternative multi-color processing (e.g., four, five, six, or more primary colors) to enhance the range of colors available to a test system. According to one embodiment, the test system may use a color scheme substantially similar to BrilliantColor™, developed by Texas Instruments Incorporated, which may enhance color fidelity and expand the range of color capacity for the test system. In some embodiments, the ability of system 100 to emulate the color gamut, or color producing capability, of a test system may be at least partially related to the color producing capability of system 100, as explained further below.

In some embodiments, the image processing performed by image processor 104 may be fine-tuned by signals received from one or more tuning input(s) 105. Such fine-tuning may be used, for example, to further enhance the color fidelity of a particular color scheme and may or may not be independent of the data received from capability manager 102. More specifically, in some embodiments, the signals received from tuning input(s) 105 may be used to enhance the emulation of a test system by system 100. In some embodiments, image processor 104 may include a graphical user interface (GUI) accessible from a client (not explicitly shown). Such a GUI may facilitate interfacing with image processor 104 and/or modifying model input(s) 105.

After performing one or more image processing functions, image processor 104 communicates a data output to emulation manager 106. According to one embodiment, the data output is in the form of a log file that includes one or more numerical descriptions of respective optical characteristics of the test system.

Emulation manager 106 generally refers to any hardware, software, firmware, or any combination of the preceding capable of managing the modification of system 100 to emulate the actual or theoretical display of a test system. Emulation manager 106 may receive signals from one or more emulation input(s) 107 that may be used, for example, to fine-tune the emulations of specific test systems. For example, emulation input(s) 107 may provide signals corresponding to gamma correction, color coordinate adjustments, hue, saturation, or brightness control, any combination of the preceding, and/or any other emulation input(s) 107. In addition, emulation manager 106 may receive emulation input(s) 107 that may be used to calibrate system 100. In some embodiments, emulation manager 106 may include a graphical user interface (GUI) accessible from a client (not explicitly shown). Such a GUI may facilitate interfacing with emulation manager 106 and/or modifying emulation input(s) 107.

In operation, emulation manager 106 generally uses data received from image processor 104 and one or more emulation input(s) 107 to modify one or more optical characteristics (e.g., color, contrast, brightness, etc.) of system 100 in a manner that effects the emulation of a test system. According to one embodiment, system 100 is capable of displaying a particular range of colors, referred to herein as a "color space," which may be represented numerically by a multi-dimensional look-up table (e.g., a table having three or more dimensions). Any of a variety of different test systems may have respective color spaces that differ from the color space of system 100.

Emulation manager 106 may perform a transformation, also referred to as a conversion, that maps each color point of the color space for system 100 to a corresponding color point within or near particular test system color space that is being emulated, as explained further below with reference to FIGS. 2A through 3. In some such embodiments, emulation manager 106 may communicate data to control module 108 that effects or otherwise represents the color point transformation. For example, the data output of emulation manager 106 may include a three-dimensional look-up table resulting from a color transformation. In addition, data corresponding to multiple test system emulations may be communicated to control manager 108 and/or stored for subsequent use. Emulation manager 106 may also communicate calibration information to control manager 108 corresponding to system 100 and/or the test system.

Control manager 108 generally refers to any hardware, software, firmware, or any combination of the preceding capable of generating a control signal that may at least partially control the operation of display engine 110. In this example, control manager 108 communicates the control signal along control line 109, which may be wireline or wireless, to display engine 110. The control signal may modify the performance of display engine 110 in a manner that effects the emulation of a test system. For example, control manager 108 may communicate control signals to display engine 110 that redefine the color space of system 100 to emulate that of a test system. The emulation may thus be effected, at least in part, in accordance with a color space transformation performed by emulation manager 106.

In some embodiments, control manager 108 may include a graphical user interface (GUI) accessible from a client (not explicitly shown). Such a GUI may facilitate interfacing with control manager 108 and/or modifying the control signals.

Display engine 110 generally refers to any hardware, software, firmware, or any combination of the preceding capable of generating an optical output 113 that is displayable on a display surface 114. Display surface 114 may include, for example, a projection screen, a television screen, a computer screen, a wall, or any other suitable display surface. In this example, display engine 100 generates optical output 113 in response to receiving a control signal and a data signal from control manager 108 and video source 112, respectively.

Video source 112 generally provides a displayable data stream to display engine 110 along data line 111, which may be wireline or wireless. The data stream may include, for example, information corresponding to one or more images, videos, overlaying objects (e.g., menus, subtitles, etc.), any combination of the preceding, or other displayable data.

In the example embodiment, control manager 108 includes a DLP Cinema® Control Program capable of controlling the operation of a display engine 110 that includes a three-chip DLP Cinema® projector; however, any suitable control manager 108 and/or display engine 110 combination may be used (e.g., alternative control managers may be communicatively coupled to display engines that include one or more liquid crystal panel(s), liquid crystal on silicon panel(s), interferometric modulator(s), other spatial light modulator(s), cathode ray tube(s), plasma screen(s), etc.). A DLP® chip is a digital micromirror device (DMD) spatial light modulator (SLM) chip available from Texas Instruments that is capable of spatially modulating received light beams. Some three-chip DLP Cinema® projectors include optics (not explicitly shown) that split a light beam such that each DLP® chip receives a respective color of light (e.g., red, green, and blue). Each DLP® chip may perform pulse-width modulation (PWM) on respectively received light beams to spatially modulate color intensity. The recombined output of the three DLP® chips may enable the display of trillions of colors. Thus, in some embodiments, the color space of some three-chip DLP Cinema® projectors is considerably expansive, thereby enabling system 100 to accurately emulate the color output of any of a variety of test systems. Further details regarding the typical color producing capabilities of some three-chip DLP Cinema® projectors are described further below with reference to FIGS. 2A through 2C.

FIGS. 2A through 2C are CIE chromaticity diagrams 200, 210, and 220 comparing some example color gamuts of respective systems 100 to the color gamuts of some example test systems. The CIE chromaticity system, which was first created by the International Commission on Illumination (CIE) in 1931, characterizes colors by a luminance parameter Y and two color coordinates x and y that collectively specify the point on the chromaticity diagram. A particular color space may thus be generally represented as a collection of points on a CIE chromaticity diagram, collectively referred to as the color gamut, that form one or more two-dimensional shapes. Color is often also described in terms of hue, saturation, and brightness. Hue is related to the wavelength for spectral colors and the terms "red" and "blue" are thus primarily describing hue. A fully saturated color is one with no mixture of white (e.g., pink may be thought of as having the same hue as red but being less saturated). Brightness may be generally quantified in terms of luminance.

FIG. 2A is a chromaticity diagram 200 that may be used to compare the human-perceivable color gamut 202 to color gamuts 204 and 206 of an example system 100 and a test system, respectively. More specifically, the largest illustrated color gamut 202 generally defines the range of color typically perceivable by the human eye. Color gamut 204 generally illustrates an example range of color displayable by system 100 according to one embodiment, which in this example includes a subset of the points forming the human-perceivable color gamut 202. In this example, system 100 is capable of producing the various colors within color gamut 204 by combining a given set of three primary colors (e.g., red, green, and blue), as represented on chromaticity diagram 200 by a triangle joining the coordinates for the three colors. In some embodiments, the three endpoints of the triangle forming color gamut 204 may each correspond to a fully saturated primary color modulated by a respective DLP® chip of a three-chip DLP Cinema® projector; however, color gamut 204 may have any suitable shape(s) that substantially represents the color-producing capability of any of a variety of alternative systems 100.

Color gamut 206 generally illustrates the range of color displayable by an example test system. In some embodiments, the points making up color gamut 206 may be at least partially determined, for example, by capability manager 102, image processor 104, and emulation manager 106 in a manner substantially similar to that described above. In this example, color gamut 206 does not form a perfect triangle. That is, point B is not collinear with a line drawn between points A and C.

In some embodiments, a color gamut substantially similar to color gamut 206 may correspond to the measured and/or modeled color space of a one-chip DLP® system. Three-chip DLP® systems typically have a larger color space and finer color gradation than systems using only one DLP® chip, as generally illustrated by the difference between color gamuts 204 and 206. More specifically, color gamut 204 includes various color points (e.g., point D) that are outside the range of color gamut 206. System 100 may perform a transformation that maps a color point D to point B, for example, thereby enabling system 100 to more accurately emulate the color performance of a test system having color gamut 206. For example, each color point of system 100 may be mapped to a nearest-neighboring point situated within the test system color gamut 206; however, any suitable mapping scheme may be used.

The test system may have any of a variety of hardware components or design parameters that may affect one or more optical characteristics, as described previously. For example, some one-chip DLP® systems include a color wheel or some other color filter that rapidly provides the DLP® chip with alternating colors of light, thereby enabling the display of field sequential images. Some such color filters are often expensive and time-consuming to produce. In various embodiments, therefore, system 100 may enable the displayed emulation of any of a variety of color wheel designs and alternations, thereby potentially reducing development time and costs.

Color points within color gamut 204 of the example system 100 may generally be emulated with a high degree of precision and accuracy. In some embodiments, however, a test system may include one or more color points outside the illustrated color gamut 204 of system 100, as illustrated in FIG. 2B.

FIG. 2B is a chromaticity diagram 210 that illustrates a color gamut 216 for an alternative example test system. The color gamut 216 of this particular test system has a greater area than color gamut 206 corresponding to the example test system of FIG. 2A. In other words, the example test system of FIG. 2B has a larger color space than the example test system of FIG. 2A. In this example, color gamut 216 includes color points outside the color gamut 204 of the example system 100. For example, color gamut 216 includes some points in the blue region of the chromaticity diagram 210 (e.g., endpoint E) that are outside color gamut 204 of the example system 100. That is, a test system 100 having color gamut 216 may be capable of producing a particular hue in the blue region of chromaticity diagram 210 that is not necessarily producible by a system 100 having color gamut 204.

In this example, only a small percentage of color gamut 216 falls outside color gamut 204. This level of discrepancy may be acceptable for some emulation purposes. In some embodiments, system 100 may perform a transformation that maps such exterior points (e.g., endpoint E) to a nearest-neighboring point within the color gamut 204 of system 100. The color gamuts of other test systems, however, may include a greater percentage of respective areas outside color gamut 204 of the example test system 100, as illustrated by FIG. 2C.

FIG. 2C is a chromaticity diagram 220 that may be used to compare the human-perceivable color gamut 202 to color gamuts 205 and 226 of an example system 100 and a test system, respectively. In this example, color gamut 205 of system 100 is greater than color gamut 204 illustrated in FIGS. 2A and 2B. In other words, the color space of system 100 in this example is greater than that of the examples illustrated in FIGS. 2A and 2B. The expanded color gamut 205 of system 100, in this example, may enable a more accurate color emulation of a test system having color gamut 226.

In some embodiments, the same or substantially the same system 100 may be used to support each of the example color gamuts 204 and 205 of FIGS. 2A through 2C. For example, adding a filter to the optics of a system 100 having a color gamut 204 as illustrated in FIGS. 2A and 2B may result in the color gamut 205 illustrated in FIG. 2C. In some such embodiments, adding such a filter may decrease the brightness of the system 100, however, which may or may not be acceptable for some emulation purposes. Thus, depending on the application and the desired emulation capabilities, the increase in area from color gamut 204 to color gamut 205 may be effected, for example, by various alternative systems 100 that may use any of a variety of technologies, optics, and hardware components. In some embodiments, however, the color gamut 204 illustrated in FIGS. 2A and 2B may be adequate for most emulation purposes. Additional details regarding example modifications that may be made to the color gamut of some systems 100 to more closely emulate the color gamut of particular test systems are described below with reference to FIG. 3.

FIG. 3 is flowchart 300 illustrating an example method for emulating a display according to one embodiment, which may be executed, at least in part, by system 100. In this example, the method generally includes at least the following acts: measuring and/or modeling one or more optical characteristics of a display; modifying the control of system 100 in accordance with the measured and/or modeled characteristic(s); and displaying an optical output 113 generated by system 100 that emulates the measured and/or modeled optical characteristic(s). In some embodiments, the emulation displayed by system 100 may at least partially simulate an optical output of an actual display and/or a particular design that may or may not be implemented as a working prototype. The display and/or design being emulated is generally referred to herein as the test system.

Act 302 includes measuring and/or modeling one or more optical characteristics of a test system. For example, the measured and/or modeled optical characteristics may correspond to the color, brightness, and/or contrast capabilities of the test system; however, any suitable optical characteristic may be modeled and/or measured. Some optical characteristic measurements may be obtained, for example, by positioning one or more optical sensors on a display surface of a test system; however, any of a variety of optical characteristics may be obtained using any suitable technique.

In addition, the modeled optical characteristics may further include information corresponding to the particular hardware components of an actual display and/or a design that may or may not be implemented as a working prototype. For example, the modeled optical characteristics may correspond to any combination or multiples of the following hardware components: light sources (e.g., lamps, light emitting diodes, lasers, etc.); color filters (e.g., color wheels, dichroic mirrors, etc.); optics (e.g., lenses, integration rods, prisms, etc.); and/or any other hardware components of a test system. More specifically, a mathematical model may consider, for example, the segments of an actual or designed color wheel in terms of their number, size, relative position, shape, and/or filter specifications; and another model may consider, for example, the brightness capabilities of a lamp in terms of lumens.

According to one embodiment, at least some of the optical characteristic(s) measured and/or modeled in act 302 may be used, for example, to generate one or more multi-dimensional look-up tables (e.g., a table having three or more dimensions). Each look-up table may numerically represent one or more corresponding optical characteristics of the test system being emulated. For example, a particular test system may be capable of displaying a particular range of colors, referred to herein as a "color space," which may include a plurality of color points that may each be represented numerically within a three-dimensional look-up table. Any of a variety of hypothetical color inputs may be mapped to a corresponding color point within the three-dimensional look-up table. For example, a hypothetical color input having three components (e.g., red, green, and blue) may be represented as $$\begin{bmatrix} R \\ G \\ B \end{bmatrix}_{Tin} \qquad \text{Equation 1}$$

where R, G, and B each have values ranging from zero to one corresponding to respective apportionments of red, green, and blue color (e.g., a white color input may be represented, for example, by assigning a value of one to R, G, and B). The use of red, green, and blue color components is for example purposes only and not intended to limit the scope of the present invention. In particular, more than three color components may be used and each color point may be described using a combination of any of a variety of primary colors or color attributes. In some embodiments, each color input may be mapped to a corresponding color point of a three-dimensional look-up table of the test system. Some such mappings may be represented as $$\begin{bmatrix} Xr & Xg & Xb \\ Yr & Yg & Yb \\ Zr & Zg & Zb \end{bmatrix}_{Tsys} * \begin{bmatrix} R \\ G \\ B \end{bmatrix}_{Tin} \qquad \text{Equation 2}$$

where X, Y, and Z represent three different parameters that describe color (e.g., hue, saturation, brightness, or any other suitable descriptors of color). In some embodiments, the optical output 113 of system 100 may be modified to emulate such a color mapping scheme, or any of a variety of alternative color mapping schemes, as described further below.

Act 304 generally includes modifying the control of system 100 in accordance with the optical characteristic(s) measured and/or modeled in act 302. According to one embodiment, system 100 is capable of emulating the color capabilities of a test system; however, any suitable optical characteristic or combination of optical characteristics may be emulated, including, for example, brightness, contrast, or any other suitable optical characteristic. The color space of system 100 may include a plurality of color points that may each be represented numerically within a three-dimensional look-up table. The color points for system 100 may be determined, for example, through measurements and/or models in a manner substantially similar to that described previously with regards to a test system; and such information may also be used, for example, to fine-tune the calibration of system 100.

In some embodiments, the color space for system 100 may be different than the color space of the test system being emulated. System 100 may thus perform a transformation that maps each color point of the color space for system 100 to a corresponding color point within or proximate to a particular test system color space that is being emulated, thereby modifying the color space of system 100 to more closely approximate the color space of the test system. The transformation may be effected, for example, by emulation manager 106 of system 100. According to one embodiment, the color point transformation may be represented as $$\begin{bmatrix} R \\ G \\ B \end{bmatrix}_{Xin} = \begin{bmatrix} Xr & Xg & Xb \\ Yr & Yg & Yb \\ Zr & Zg & Zb \end{bmatrix}_{Xsys}^{-1} * \begin{bmatrix} Xr & Xg & Xb \\ Yr & Yg & Yb \\ Zr & Zg & Zb \end{bmatrix}_{Tsys} * \begin{bmatrix} R \\ G \\ B \end{bmatrix}_{Tin} \quad \text{Equation 3}$$

where Xin represents a particular color input that may be provided to system 100, and Xsys is a color matrix that may be used to represent the calibrated color points that collectively form the color space of the system 100. More specifically, in this example, each color input Xin may have R, G, and B values ranging from zero to one that correspond to respective apportionments of red, green, and blue color; and the X, Y, and Z values of the Xsys color matrix for system 100 may each represent respective parameters that describe color (e.g., hue, saturation, brightness, or any other suitable descriptors of color). In this example, the effects of such a color transformation are represented in the control signals communicated from control module 108 to display engine 110. Thus, in some embodiments, a particular color input Xin that may be received by system 100 will be displayed as a modified color in accordance with the color transformation. By way of comparison, if no color transformation is performed, system 100 may generate a display that includes the full color capabilities of system 100.

Act 306 generally includes displaying an optical output 113 generated by system 100 that emulates the measured and/or modeled optical characteristic(s). For example, video source 112 may provide a displayable data stream or image to display engine along data line 111 to display engine 110. Display engine may receive a control signal along control line 109 and, in response, generate an optical output 113 that enables a displayable representation of the data stream or image in a manner that emulates the color capabilities of a test system. That is, system 100 enables the display of an input that at least partially emulates the display a test system would hypothetically generate in response to the same input.

Thus, in some embodiments, system 100 may enable the emulation of various different displays, thereby allowing viewers to evaluate and compare the effects of any of a variety of design considerations. Some such design considerations may include, for example, detailed specifications of particular hardware components, image processing techniques, or any of a variety of other suitable design considerations. The ability to efficiently emulate various different displays may significantly reduce research and development time and corresponding costs. For example, multiple iterations of various color filter designs may be efficiently and accurately evaluated by emulation without necessarily building a color filter for each evaluation. In some embodiments, a particular display surface 114 may be partitioned such that an emulation can be compared to an existing display system. In other embodiments, different emulations for various test systems may be displayable by system 100 and may be evaluated successively or substantially simultaneously.

In some embodiments, a particular display surface 114 may be partitioned such that different emulations for various test systems may be displayable by system 100 at the same time. In this manner, side-by-side test system emulations may be evaluated substantially simultaneously.

Although the present disclosure has been described with several embodiments, a myriad of changes, variations, alterations, transformations, and modifications may be suggested to one skilled in the art, and it is intended that the present disclosure encompass such changes, variations, alterations, transformations, and modifications as fall within the scope of the appended claims.

What is claimed is:

1. A method for emulating the color performance and brightness of a display system, comprising:
- receiving, at a first display system, data corresponding to an expected color gamut and brightness of a second display system, the first display system having a first color gamut and brightness different than the expected color gamut and brightness of the second display system;
- receiving display data at the first display system;
- transforming the display data into a format usable by the first display system, the format emulating the expected color gamut of the second display system; and
- displaying by the first display system an emulation of the brightness and color producing capability of the second display system using at least the converted display data;
- wherein the display data comprises a first plurality of color inputs each having a respective first plurality of color descriptors; and
- wherein the format emulating the expected color gamut of the second display system comprises a second plurality of color inputs each having a respective second plurality of color descriptors, the respective second plurality of color descriptors comprising a greater number of color descriptors than the respective first plurality of color descriptors.

2. The method of claim 1, wherein the expected color gamut of the second display system design is determined, at least in part, by mathematically modeling an optical characteristic of one or more components of the second display system.

3. The method of claim 1, wherein the expected color gamut of the second display system is determined, at least in part, by measuring an optical characteristic of the second display system.

4. The method of claim 1, further comprising mapping each of a plurality of color points of the first color gamut to respective ones of a plurality of color points of the expected color gamut.

5. The method of claim 1, wherein the first display system comprises a three-chip digital micromirror device spatial light modulator projector.

6. The method of claim 1, wherein the data corresponding to an expected color gamut of a second display system is data corresponding to an expected color gamut of a second display system design.

7. A method for emulating a display system, comprising:
- determining an expected first color producing capability;
- converting display data into a format that emulates the first color producing capability; and
- displaying the converted display data by a first display system having an expected second color producing capability different than the expected first color producing capability;
- wherein the display data comprises a first plurality of color inputs each having a respective first plurality of color descriptors; and
- wherein the format that emulates the expected first color producing capability comprises a second plurality of color inputs each having a respective second plurality of color descriptors, the respective second plurality of color descriptors comprising a greater number of color descriptors than the respective first plurality of color descriptors.

8. The method of claim 7, wherein the determining further comprises measuring an output of a second display system having the expected first color producing capability.

9. The method of claim 7, wherein the determining further comprises mathematically modeling an output of a second display system having the expected first color producing capability.

10. The method of claim 7, wherein the determining further comprises mathematically modeling a theoretical output of a second display system design having the expected first color producing capability.

11. The method of claim 7, further comprising mapping each of a plurality of color points of a first table having three dimensions to respective ones of a plurality of color points of a second table having three dimensions, the first and second tables indicative, respectively, of the expected first color producing capability and the expected second color producing capability.

12. The method of claim 7, wherein the first display system comprises a plurality of digital micromirror device spatial light modulator chips.

13. The method of claim 7, wherein the determining further comprises modeling an output of a second display system having the expected first color producing capability; one or more digital micromirror device spatial light modulator chips; and a color wheel optically coupled to the one or more digital micromirror device spatial light modulator chips.

14. The method of claim 7, wherein the first display system comprises one or more spatial light modulators.

15. The method of claim 14, wherein the first display system further comprises one or more light emitting diodes (LEDs).

16. A method for emulating a display system, comprising:

determining expected first and second color producing capabilities;

converting display data into a format that emulates the first and second color producing capabilities; and displaying the converted display data by a first display system having an expected third color producing capability different than the expected first color producing capability;

wherein the displaying the converted display data includes displaying a first emulation of the first color producing capability and a second emulation of the second color producing capability, the first and second emulations displayed sequentially with respect to each other.

17. A method for emulating a display system, comprising:

determining expected first and second color producing capabilities;

converting display data into a format that emulates the first and second color producing capabilities; and displaying the converted display data by a first display system having an expected second color producing capability different than the expected first color producing capability, wherein displaying the converted display data includes displaying a first emulation of the first color producing capability by a first portion of the first display system, and displaying a second emulation of the second color producing capability by a second portion of the first display system, the first and second emulations displayed substantially simultaneously.

* * * * *